(12) United States Patent
Fortunato et al.

(10) Patent No.: US 12,088,310 B2
(45) Date of Patent: Sep. 10, 2024

(54) CALIBRATION METHOD FOR PHASE-LOCKED LOOPS AND RELATED CIRCUIT

(71) Applicant: STMicroelectronics S.r.l., Agrate Brianza (IT)

(72) Inventors: Davide Nicolo Fortunato, Catania (IT); Antonino Calcagno, Messina (IT); Marco Vinciguerra, Catania (IT); Angelo Scuderi, Catania (IT); Gaetano Cosentino, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 27 days.

(21) Appl. No.: 18/192,285

(22) Filed: Mar. 29, 2023

(65) Prior Publication Data

US 2023/0327677 A1    Oct. 12, 2023

(30) Foreign Application Priority Data

Apr. 12, 2022    (IT) .......................... 102022000007268

(51) Int. Cl.
| | | |
|---|---|---|
| *H03L 7/099* | (2006.01) | |
| *H03L 7/087* | (2006.01) | |
| *H03L 7/10* | (2006.01) | |
| *H03L 7/113* | (2006.01) | |

(52) U.S. Cl.
CPC ............ *H03L 7/0992* (2013.01); *H03L 7/087* (2013.01); *H03L 7/099* (2013.01); *H03L 7/103* (2013.01); *H03L 7/113* (2013.01); *H03L 2207/06* (2013.01)

(58) Field of Classification Search
CPC ..... H03L 2207/06; H03L 7/099; H03L 7/087; H03L 7/113; H03L 7/10; H03L 7/101; H03L 7/102; H03L 7/103; H03L 7/181
See application file for complete search history.

(56) References Cited

U.S. PATENT DOCUMENTS

| | | |
|---|---|---|
| 8,872,556 B1 | 10/2014 | Chen et al. |
| 2003/0048139 A1* | 3/2003 | Chien ..................... H03L 7/199 331/25 |
| 2009/0115537 A1 | 5/2009 | Ramaswamy et al. |

FOREIGN PATENT DOCUMENTS

CN        101951259 A        1/2011

* cited by examiner

*Primary Examiner* — Ryan Johnson
(74) *Attorney, Agent, or Firm* — Slater Matsil, LLP

(57) ABSTRACT

A voltage-controlled oscillator in a phase-locked loop circuit is calibrated via a dichotomous search in a set of candidate frequency bands via a sequence of subsequent halving steps that produce reduced subsets of the set of candidate frequency bands. The reduced subsets have respective upper bound values and lower bound values, as well as central values. The central value of the subset resulting from the halving step of index i in the sequence is a function of the average of the upper bound value and the lower bound value of the subset resulting from the halving step of index i−1 in the sequence.

20 Claims, 10 Drawing Sheets

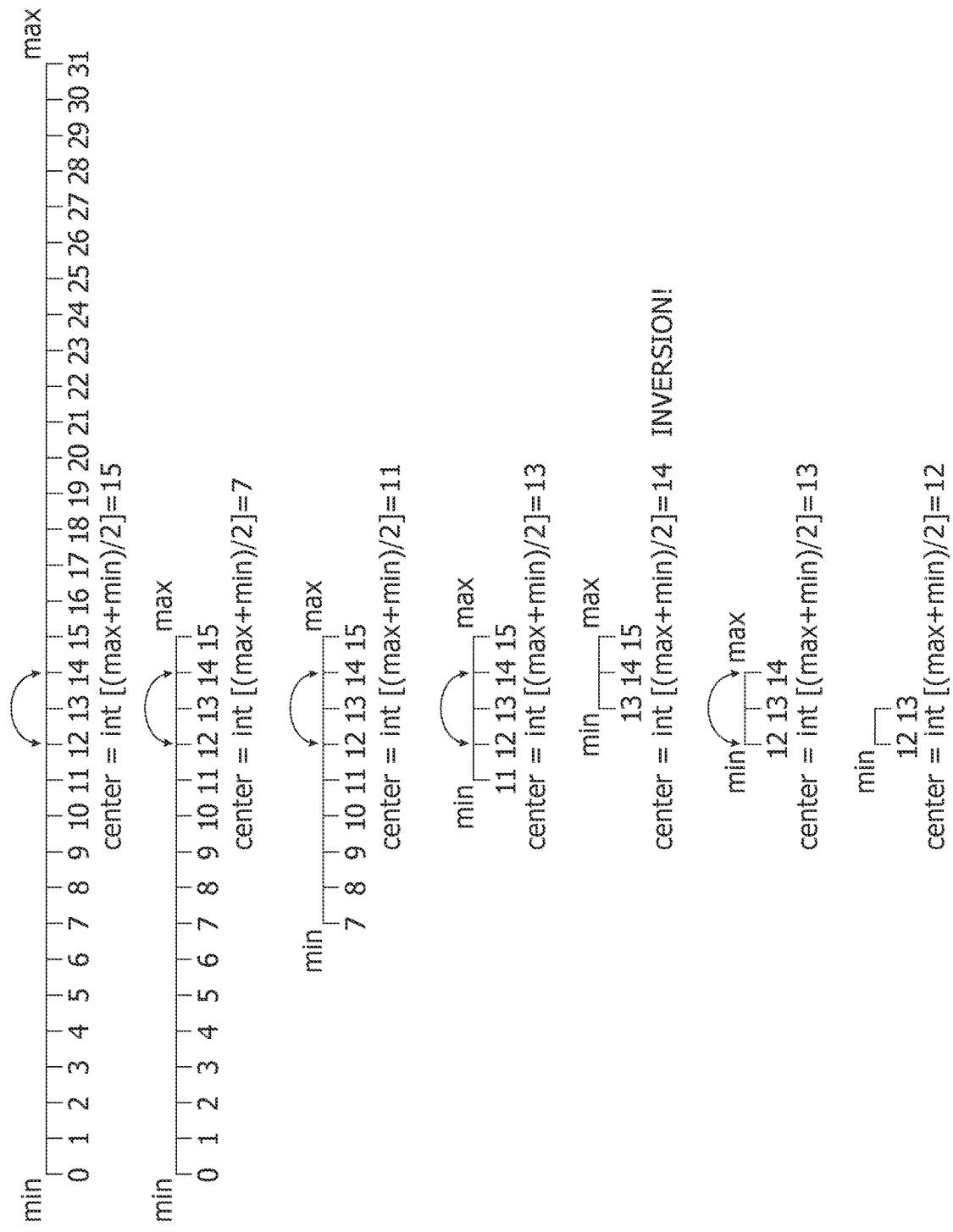

CALIBRATION METHOD FOR PHASE-LOCKED LOOPS AND RELATED CIRCUIT

CROSS-REFERENCE TO RELATED APPLICATIONS

This application claims the benefit of Italian Patent Application No. 102022000007268, filed on Apr. 12, 2022, which application is hereby incorporated herein by reference.

TECHNICAL FIELD

The description relates to phase-locked loop (or phase lock) circuits, currently referred to with the acronym PLL, and related methods.

BACKGROUND

Phase-locked loop circuits have been used in a wide variety of possible applications, with renewed interest stimulated in recent times in areas such as automotive radar/digital radio, for advanced driver assistance system (ADAS) and infotainment applications, for instance.

In its simplest form, a PLL circuit comprises a variable frequency oscillator (VCO) controlled by a detector that compares the phase of the VCO signal with the phase of the input signal and drives the oscillator to keep those phases in a matched ("locked") relationship.

Low-noise performance of a PLL circuit involves a trade-off with the VCO (analog) tuning range.

A capacitor bank controlled by digital switching bits can be used to compensate process variations in the synthesized operating frequency.

A problem arising when finding a correct analog tuning range in high-frequency VCOs lies in that the digital capacitor(s) may give rise to non-monotonous characteristics. This phenomenon is related to parasitic connections that cannot be easily balanced for a resonator with many bits.

SUMMARY

An object of one or more embodiments is to contribute in adequately addressing the problem discussed in the foregoing.

According to examples described herein, such an object is achieved via a method having the features set forth in the claims that follow.

One or more embodiments relate to a corresponding circuit.

The claims are an integral part of the technical teaching provided herein in respect of the embodiments.

Examples as discussed herein facilitate (automatically) finding an adequate VCO tuning range at PLL start-up also in the presence of a capacitor bank giving rise to a non-monotonous VCO characteristic.

Examples as discussed herein provide a VCO calibration technique for PLL circuits wherein a finite state machine (FSM) uses a dichotomous procedure in searching a capacitance value that facilitates the VCO in setting an adequate (central) frequency for PLL calibration.

In examples as discussed herein, such a finite state machine may operate in open-loop conditions, with a constant tuning voltage (e.g., Vtune=0.5V).

An FSM-based calibration procedure according to examples discussed herein facilitates VCO calibration and reaching PLL lock even in conditions of non-monotonicity of the VCO characteristic.

Examples as discussed herein offer advantages such as recovery from non-monotonous VCO characteristic and countering undesired infinite bounce-among-steps operation, with error report.

BRIEF DESCRIPTION OF THE DRAWINGS

One or more embodiments will now be described, by way of example only, with reference to the annexed figures, wherein:

FIG. 10 summarizes a possible practical implementation of embodiments of the present description.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION OF ILLUSTRATIVE EMBODIMENTS

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Figure 1:
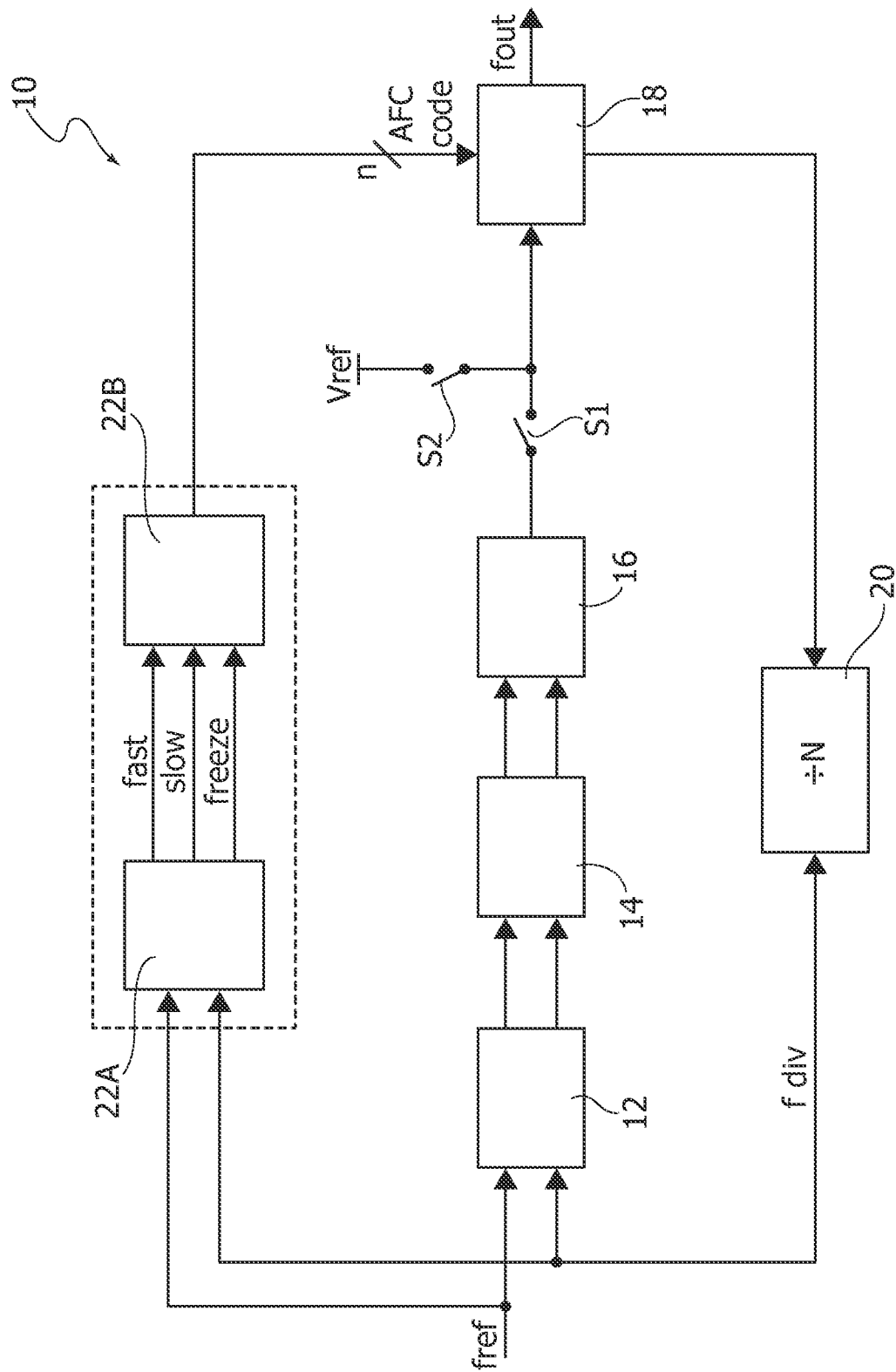
FIG. 1 is a block diagram of a conventional PLL circuit.

FIG. 1 is a block diagram of a phase-locked loop (phase lock) circuit 10, currently referred to as PLL.

In FIG. 1, reference 12 denotes a phase frequency detector (PFD) that receives an input signal at a certain frequency $f_{ref}$ and a (local) comparison signal at a frequency $f_{div}$ produced as discussed in the following.

The output signal from the PFD 12 is applied to a charge pump (CP) 14 whose output is in turn applied to a (e.g., low-pass) loop filter (LF) 16 to control a voltage-controlled oscillator (VCO) 18.

The VCO outputs an output signal at an oscillation frequency $f_{out}$ that is proportional to an input voltage applied thereto and "phase-locked" (hence the designation of the circuit) to the input signal $f_{ref}$.

The output signal from the VCO 18 is used to close the loop on the PFD 12 via a 1/N frequency divider 20 that produces the comparison signal at a frequency $f_{div}$.

Adequate locking of the PLL is facilitated by the VCO 18 being operated in an analog tuning range capable of synthesizing the frequency $f_{out}$ of interest.

To that effect, the VCO 18 can be "calibrated" by opening the loop at a switch S1 upstream of the VCO 18 that is coupled to a reference signal $v_{ref}$ via a second switch S2 (this is open, that is non-conductive, in normal operation).

Under these conditions, a n-bit (e.g., n=4) automatic frequency control (AFC) code is applied to the VCO 18. As illustrated in FIG. 1, the AFC code is produced in an open-loop arrangement of a frequency detector 22A that receives the input signal $f_{ref}$ and the frequency-divided signal $f_{div}$ and controls a finite state machine (FSM) 22B via fast, slow, and freeze signals during the calibration procedure.

As illustrated in FIG. 1 the FSM 22B outputs an n-bit (e.g., a four-bit) AFC code $b_0, b_1, b_2, b_3, \ldots, b_n$ that is used to compensate process variations in the synthesized operating frequency of the VCO 18 via a capacitor bank controlled by digital switching bits based on the signals fast, slow, freeze. Such a capacitor/capacitance bank can be termed a "digital" one insofar as its values are determined based on a digital word (the AFC code, e.g., $b_0, b_1, b_2$).

Architecture and operation of a PLL circuit as discussed so far are conventional in the art, which makes it unnecessary to provide a more detailed description herein.

Architecture and operation of a PLL circuit as discussed herein are otherwise exemplary of a wide variety of PLL architectures where the same issues discussed in the following may arise.

As a consequence, the examples presented herein shall not be construed, even indirectly, as limited to the exemplary architecture of a PLL circuit 10 as discussed herein.

Whatever the specific implementation, a problem (encountered primarily with high-frequency VCOs) in finding an adequate analog tuning range lies that the "digital" capacitance used to calibrate the VCO 18 exhibits a non-monotonous characteristic. This is related to parasitic connections that cannot be easily balanced for a resonator with many bits.

To summarize:
adequate locking of a PLL circuit is facilitated by the VCO therein being in an analog tuning range capable of synthesizing the frequency of interest;
PLL performance (primarily low-noise performance) involves a trade-off with the VCO analog tuning range: circuits with a narrow analog tuning range exhibit better phase noise performance;
in order to compensate process variation in the synthesized operating frequency, a capacitor bank (e.g., with capacitors suited to individually activated/de-activated) is associated to the VCO 18 controlled by digital switching bits such as, e.g., $b_0, b_1, b_2, b_3$. For instance (these quantitative figures are merely exemplary) an analog VCO tuning range TR=150 MHz facilitates achieving a total tuning range TR=1.5 GHz (including switching capacitors); and
a problem likely to arise in finding a correct analog tuning range lies in that such a digital capacitance provides non-monotonous characteristics, due to parasitic connections that cannot be easily balanced for a resonator with many bits.

Examples discussed herein thus address the problem of automatically finding an analog tuning range at circuit start-up also in the presence of case of a ("digital") capacitor bank providing non-monotonous VCO characteristics.

Figure 2:
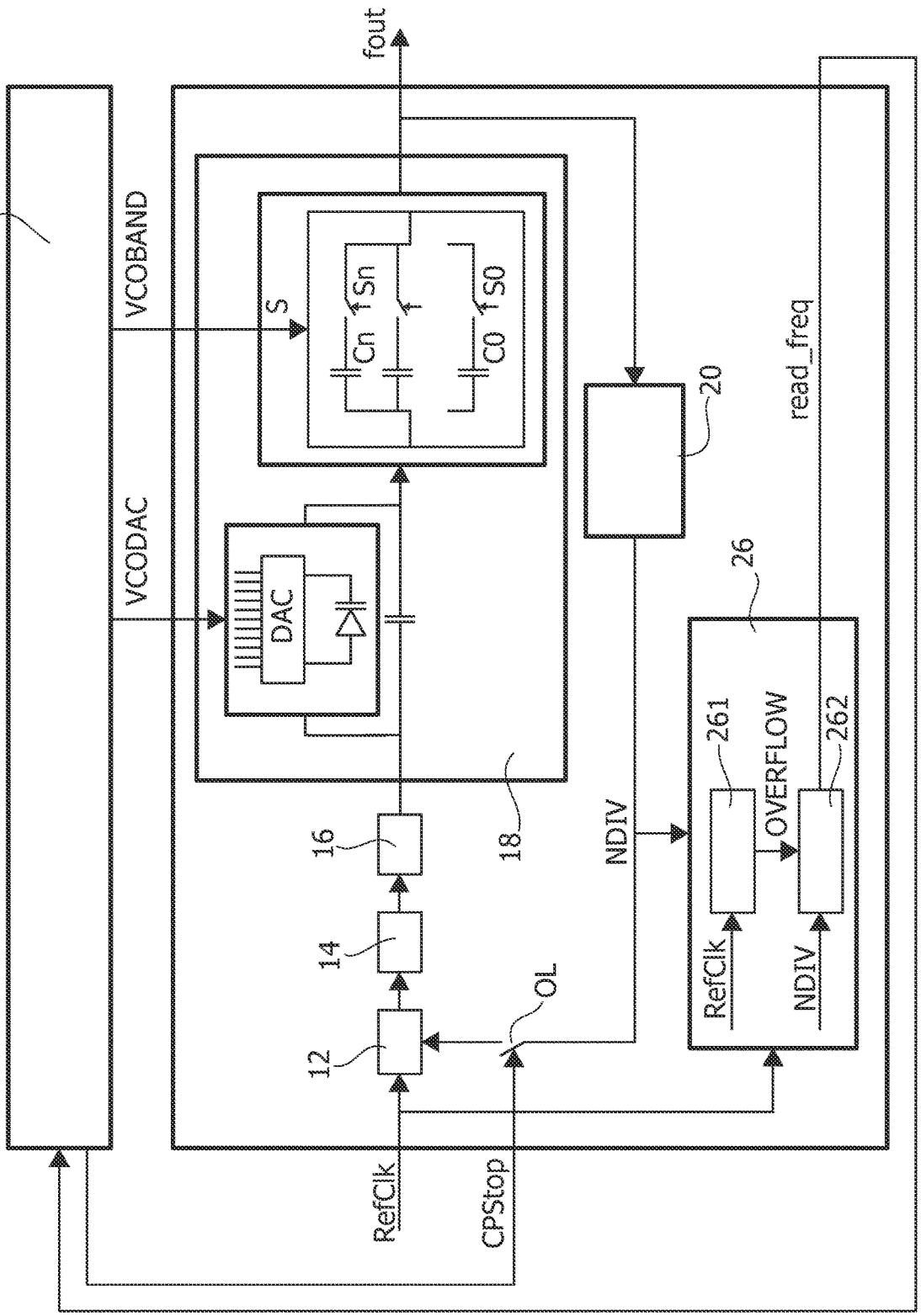
FIG. 2 is a block diagram of a PLL circuit configured to apply embodiments of the present description.

FIG. 2 is a block diagram of a PLL circuit configured to apply embodiments of the present description.

Unless otherwise indicated, corresponding numerals and symbols in the figures generally refer to corresponding parts: a detailed description will not be repeated for each figure for brevity, being otherwise understood that certain parts or elements being indicated with a same reference in plural figures does not imply that these parts or elements shall be implemented in the same manner.

A PLL circuit 10 as illustrated in FIG. 2 thus comprises a phase frequency detector (PFD) 12, a charge pump (CP) 14, a low-pass filter (LPF) 16, a voltage-controlled oscillator (VCO) 18 and an integer/fractional/sigma-delta N frequency divider 20 (e.g., a 1/192 frequency divider).

Reference 26 denotes is a counter that "counts" the divided output frequency NDIV (e.g., 50 MHz=9.6 GHz/192) from the divider 20 and also receives the reference clock signal RefClk that is applied to the PFD 12.

The counter 26 outputs a frequency read_freq towards a finite state machine (FSM) 122. The FSM 122 facilitates calibrating (automatically) the VCO 18 based on the frequency read by the counter 26 via control information (signals) for the VCO 18 designated VCOBAND (coarse calibration) and VCODAC (fine calibration). Calibration of the VCO 18 via the FSM 122 takes place in an open-loop operation, with a switch OL controlled by a signal CPStop from the FSM 122, switched "open", that is, made non-conductive (see also the switches S1 and S2 in FIG. 1).

The signals VCOBAND (coarse calibration) and VCODAC (fine calibration) facilitate selecting an adequate value for the "digital" capacitance (e.g., the AFC code comprised of the bit word $b_0, b_1, b_2, b_3, \ldots, b_n$) to achieve a desired frequency of operation of the VCO 18.

As discussed in the following, the FSM 122 is also configured to report end of calibration, as well as error in case of calibration failure.

Figure 3:
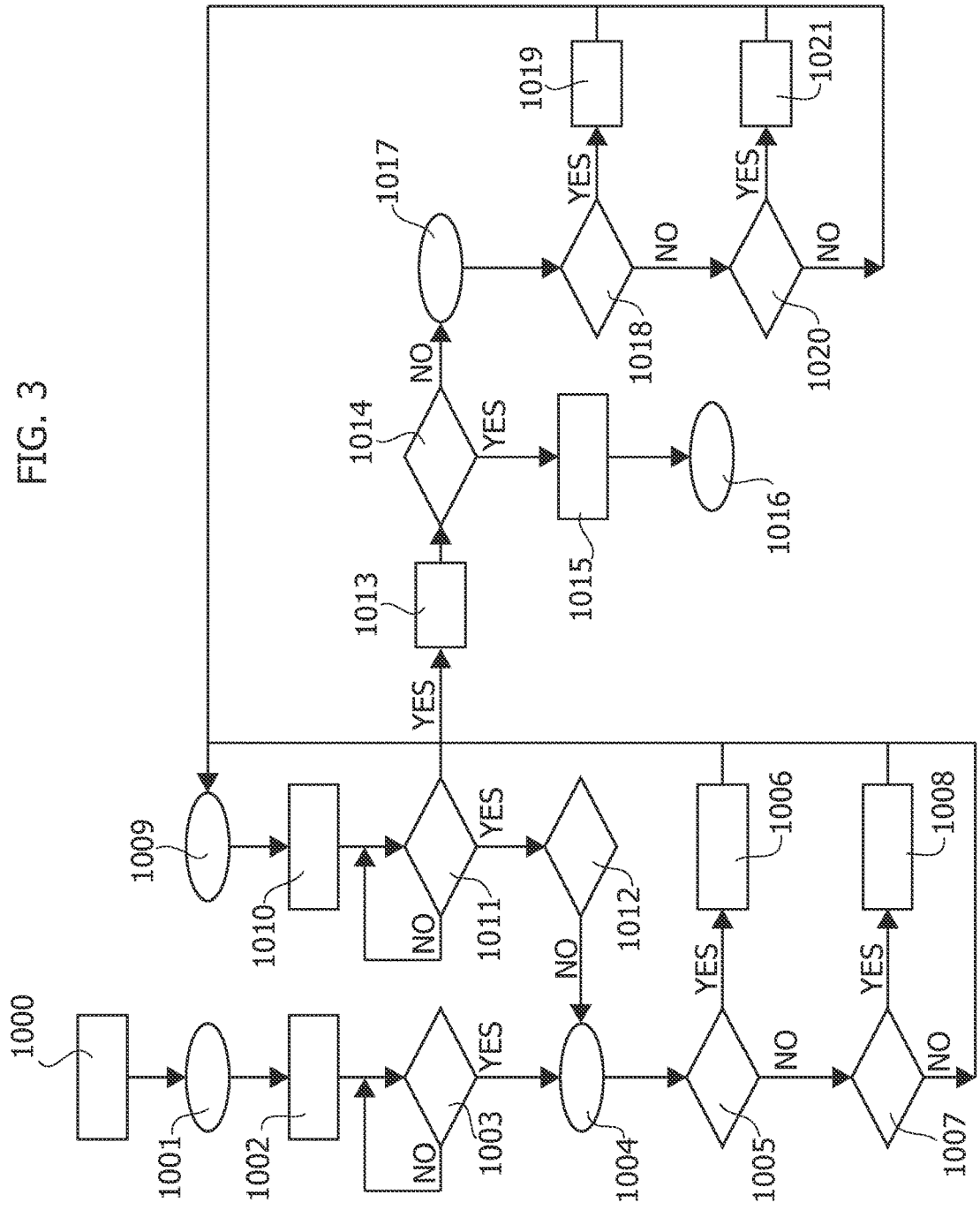
FIG. 3 is a flow chart exemplary of a coarse-fine PLL calibration procedure.

FIG. 3 is a flow chart exemplary of possible operation of a PLL circuit 10 as illustrated in FIG. 2, assuming, for the time being, a monotonous VCO characteristic.

The meaning of the blocks in the flow chart of FIG. 3—where, in the blocks involving a check, YES denotes a positive outcome and NO denotes a negative outcome—is reproduced in the following list; further explanations on the steps represented by the blocks are given in the description following the list.

Block 1000: enable PLL/FSM
Block 1001: initialize
Block 1002: variable initialization—start count in counter 26
Block 1003: FRQCNTOVF=1; frequency count overflow
Block 1004: CAL_VCOBAND; calibrate VCO band
Block 1005: read_freq>f_des+tol; frequency read higher than desired plus tolerance
Block 1006: max_BAND=centr_BAND; min_BAND=min_BAND Block 1007: read_freq<f_des−tol; frequency read lower than desired minus tolerance Block 1008: max_BAND=max_BAND; min_BAND=centr_BAND Block 1009: idle; from the output of either of blocks 1006 and 1008, OR a negative output from block 1007, OR from the output of either of blocks 1019 and 1021, OR a negative output from block 1021

Block 1010: centr=(max+min)/2 (for coarse calibration) OR centr_DAC=(max_DAC+min_DAC)/2 (for fine calibration); restart count Block 1011: FRQCNTOVF=1; frequency count overflow Block 1012: end of VCOBAND (coarse) calibration Block 1013: VCOBAND=centr_BAND Block 1014: end Of VCODAC (fine) calibration Block 1015: VCODAC=centr_DAC Block 1016: EO_CAL Block 1017: CAL_VCODAC Block 1018: read_freq<f_des−tol; frequency read lower than desired minus tolerance Block 1019: max_DAC=centr_DAC; min_DAC=min_DAC Block 1020: read_freq>f_des+tol; frequency read higher than desired plus tolerance Block 1021: max_DAC=max_DAC; min_DAC=centr_DAC As noted, from the output of either of blocks 1019 and 1021, or the negative output of block 1020, the procedure evolves towards the idle state of block 1009.

To summarize, the procedure exemplified by the flow chart of FIG. 3 starts with PLL enable (block 1000), opening the loop (block 1001—see also the switches S1 and S2 in FIG. 1, not reproduced in FIG. 2 for simplicity) and initializing the variables for the procedure (block 1002), with the frequency count started.

At the end of the count (outcome YES of block 1003), in blocks 1005 and 1007 the frequency read (read_freq) resulting from the VCOBAND coarse calibration (block 1004) is compared in terms of clock cycle number with a parametrized range [f_des_cycle−tol; f_des_cycle+tol]—expressed in cycles counted, including a tolerance value tol (e.g., tol=6 for a "coarse" calibration).

At this point, new extremes and a new center are set in blocks 1006 and 1008 for a new half-range depending on the read_freq value.

If read_freq is higher than f_des_cycle+tol (positive outcome YES of block 1005) a new maximum value (new_max) is set in block 1006 equal to the old one (old_max) with a new center value set to (old_max+old_min)/2 with a new minimum value (new_min) set to the old one (old_min).

If read_freq is lower than f_des_cycle−tol (positive outcome Y of block 1007) new_max is set in block 1008 to the old one (old_max) with a new center value set to (old_max+old_min)/2 with a new minimum value (new_min) set to the old center value (old center).

If read_freq is included in the range [f_des_cycle−tol; f_des_cycle+tol], in response to negative outcomes from both blocks 1005 and 1007, the last value for new_center is chosen as a VCOBAND control value and the count is restarted (block 1010).

This point marks the end of a VCOBAND search (coarse calibration, e.g., tol=6), and the FSM 122 starts a VCODAC search (fine calibration) following steps 1011 to 1021 similar to the steps 1003 to 1008 discussed above, but using a lower tolerance value (e.g., tol=+/−1).

It is otherwise noted that the coarse calibration procedure and the fine calibration may include interval re-assignment options that are mutually complementary (inverted).

The FSM 122 can be configured to perform a dichotomous search as discussed previously based on five (5) states:
an INIT state, for initialization and first count;
an IDLE state, for halving and for counts;
a CAL_VCOBAND state, for read frequency comparison and re-assignment of range extremes for VCOBAND (coarse) calibration;
a CAL_VCODAC state, for frequency reading comparison and re-assignment of range extremes for VCODAC (fine) calibration; and
an EO_CAL state, for calibration end.

A recovery feature can be envisaged if calibration fails, in order to avoid an infinite "bouncing" around a certain.

For instance:
for VCOBAND (coarse) calibration one can select a 5-bit vector for VCOBAND, with a maximum of 5 internal steps foreseen for calibration (plus 2 of tolerance);
for VCODAC (fine) calibration one can select a 9-bit vector for VCODAC with a maximum of 9 internal steps foreseen for calibration (plus 2 of tolerance).

Consequently, a maximum of, e.g., M=7 steps for VCOBAND calibration and of, e.g., M=11 steps for VCODAC calibration can be selected. When the number of steps reaches the relative threshold, an error signal report the failure.

Figure 4:
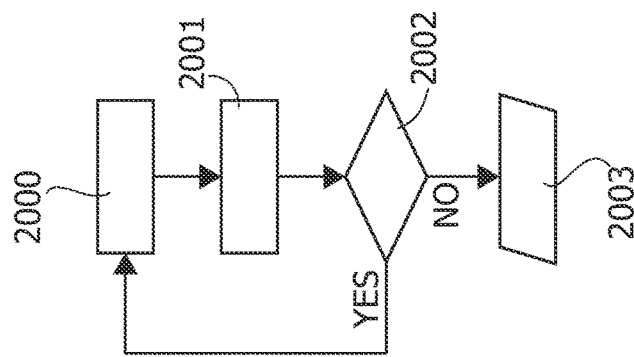
FIG. 4 is a further flow chart exemplary of possible details of embodiments of the present description.

This mode of operation can be implemented in the FSM 122 as exemplified in the flow-chart of FIG. 4, where the blocks 2000 to 2004 have the following meaning:
block 2000—binary search halving started with step #1;
block 2001—step count increased;
block 2002—current step count compared with threshold M (e.g., M=7 for VCOBAND and, e.g., M=11 for VCODAC), if threshold not reached yet (NO), back to block 2000;
block 2003—in response to threshold M reached (YES in block 2002) calibration error message issued.

Figure 5:
FIGS. 5, 6, and 7 are diagrams exemplary of operation of embodiments of the present description with FIG. 6 being an enlarged view of the portion of FIG. 5 indicated by arrow VI.

By way of further explanation, FIG. 5 shows an (exemplary) diagram of VCO frequency Fvco versus VCO tuning voltage Vtune for various VCO bands (e.g., VCOBAND 11, VCOBAND 12, VCOBAND 13, VCOBAND 14, VCOBAND 15) referring to a monotonous VCO characteristic.

This representation assumes that, at the end of open-loop calibration, the FSM 122 has set, e.g., VCOBAND=14, VCODAC=255 with Vtune=0.5V (these values are, of course, merely exemplary).

Figure 6:
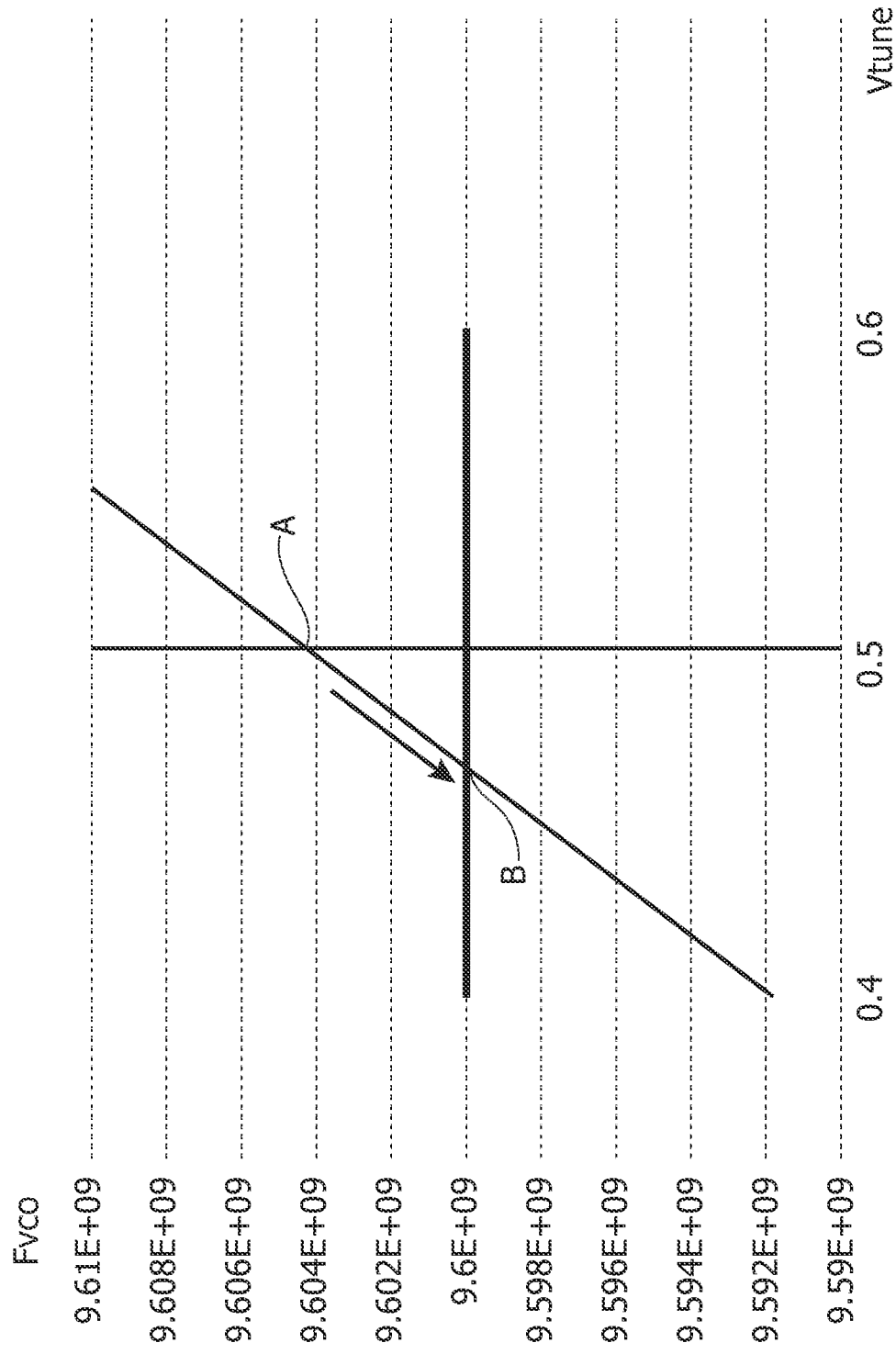

FIG. 6 is an enlarged view of the portion of FIG. 6 indicated by arrow VII, showing that, when the FSM 122 closes the loop (switch OL closed, that is, made conductive again) a point A in the last step in open-loop calibration (block 1016 in FIG. 2 corresponds to Vtune=0.5V and Fvco=9.604 GHz in fact "moves" to a point B corresponding to Vtune=0.468V and Fvco=9.6 GHz.

It is again recalled that a four-bit "digital" capacitor bank based on bits $b_0$, $b_1$, $b_2$, and $b_3$ (makes it possible to produce $2^4$=16 (sixteen) VCO bands. Referring to a four-bit "digital" capacitor bank is of course merely exemplary: for instance, five bits and nine bits can be used for coarse tuning (VCOBAND) and fine tuning (VCODAC), respectively.

Whatever the number of bits, since there is a correspondence between the VCO band selected and the capacitors in the bank, a capacitor swap leads to a VCO characteristic "swap", that is, to a VCO band being finally implemented which differs from the VCO band selected.

Figure 7:
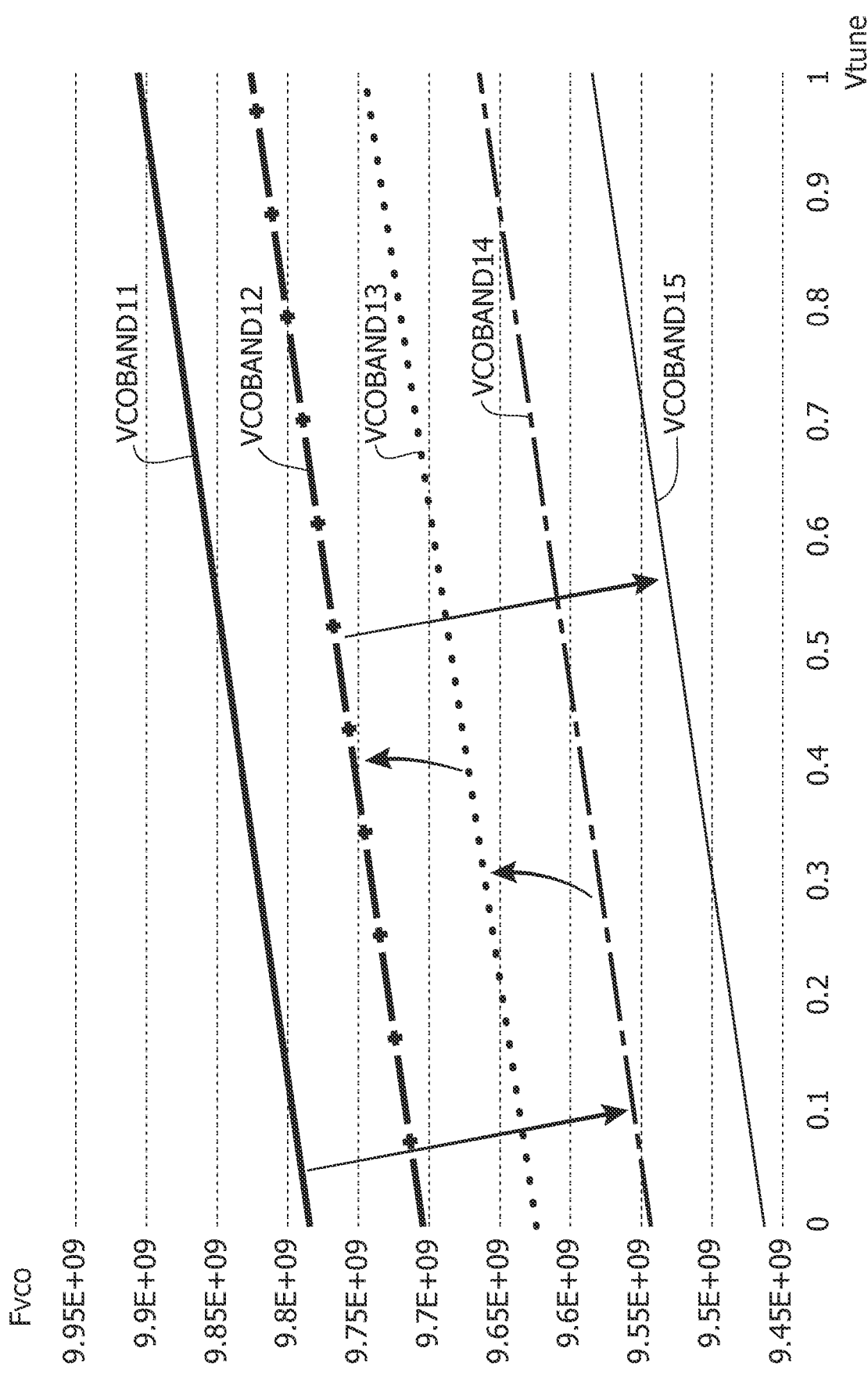

FIG. 7 is a diagram exemplary of a case of non-monotonicity of the VCO characteristic. Assuming that the capacitive value increases as VCOBAND increases, the trend may be non-linear: e.g., 11-14-13-12-15.

This issue can be addressed taking advantage of the fact that the read frequency can be expressed in terms of clock cycles of the signal RefClk counted by the counter 26.

For instance (see FIG. 2) the frequency counter 26 can include two (inner) counters 261 and 262. The former counter 261 is an N-bit counter that counts the reference signal RefClk over a count window. The latter counter 262 is a (N+1)-bit counter that counts the divide clock NDIV. The N-bit counter, once at overflow, stops the (N+1)-bit counter 262 that can have a value higher or lower than $2^N$. A comparison will then be made (as discussed in the following) between such a value and $2^N$ plus or minus a tolerance (+/−tol).

Figure 8:
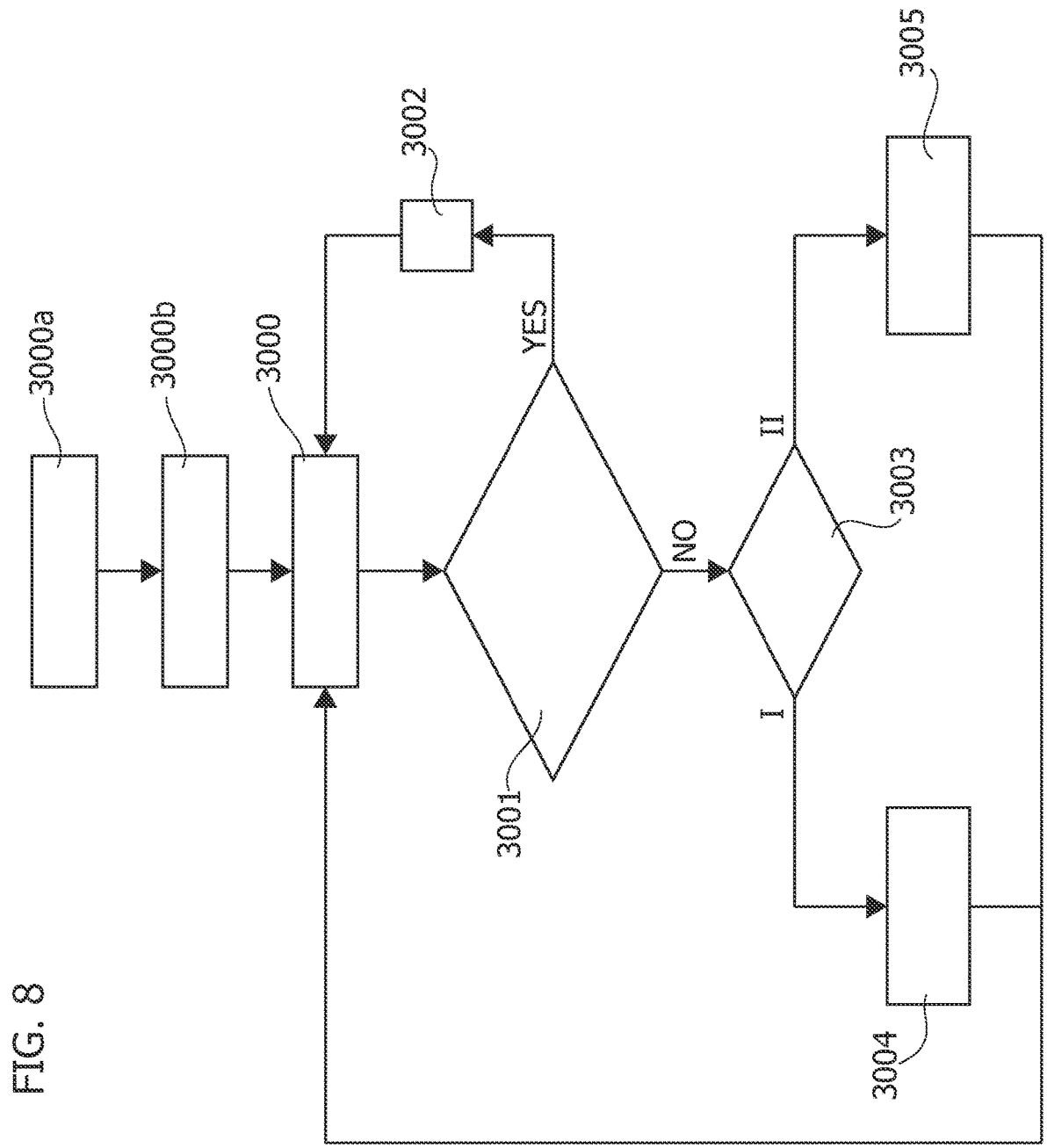
FIG. 8 is a further flow chart exemplary of possible details of embodiments of the present description.
Figure 9A:
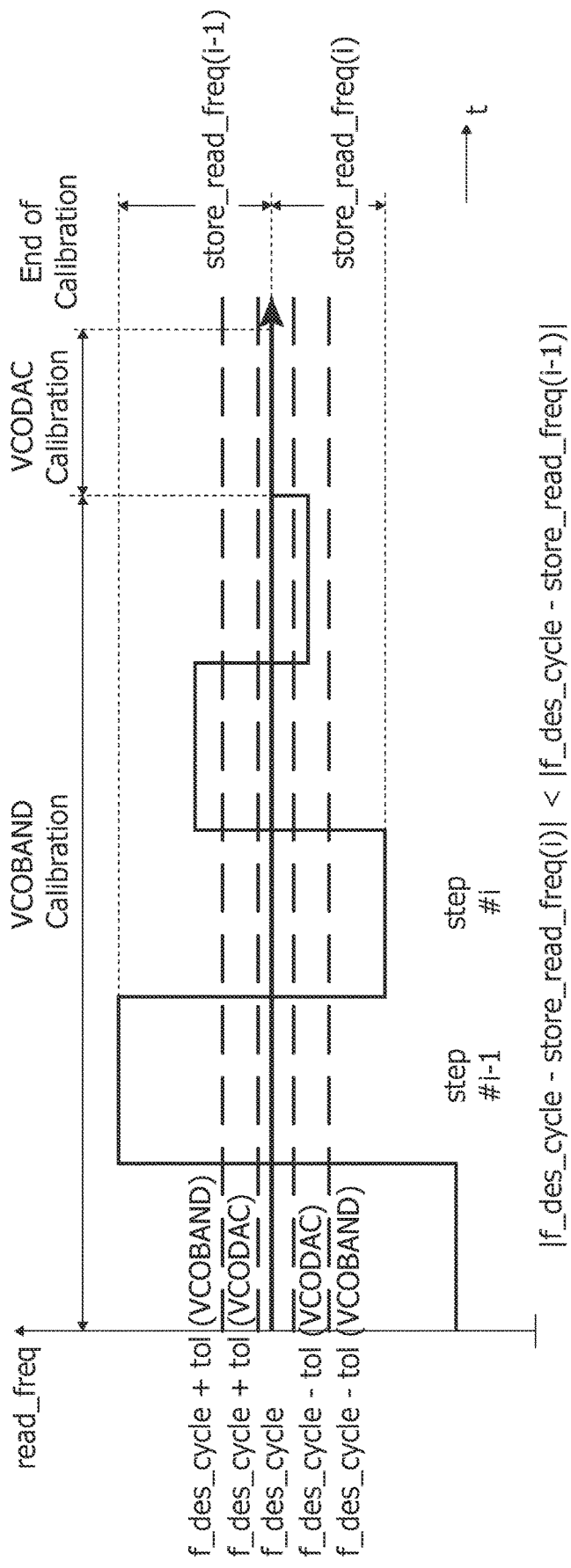
FIGS. 9A and 9B are diagrams exemplary of operation of embodiments of the present description.
Figure 9B:
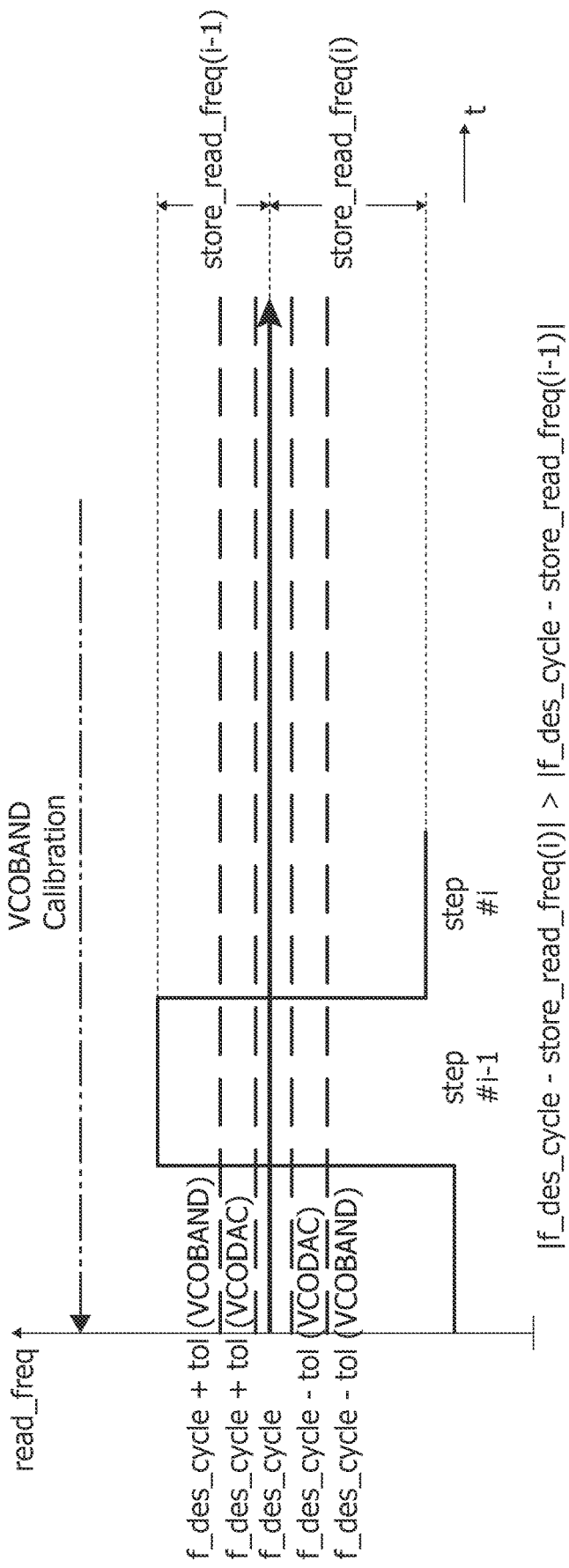

Corresponding operation may be based on the procedure exemplified in FIGS. 8, and 9A, 9B.

Such a procedure can be regarded as an improvement suited to be applied to the procedure exemplified by blocks 1004 to 1012 (coarse calibration) and 1012 to 1021 (fine calibration) in the flow-chart of FIG. 3.

The procedure involves defining an entity store_read_freq as an array of N elements, where N is the exponent for which $2^N$ equals the number of capacitors in the "digital" capacitance (for instance N=2 for a four-bit capacitance $b_0$, $b_1$, $b_2$, $b_3$), with N representing the max halves number in a dichotomous search procedure.

The procedure also involves the value read_freq for the actual value of frequency read and defining an index i=index from 1 to N.

By referring to the flow-chart of FIG. 8, the binary search procedure for a VCO calibration frequency (where the block 3000 essentially corresponds to the whole binary search described in connection with FIG. 3) starts with two preliminary steps represented by the blocks 3000a and 3000b.

In the step 3000a (step i=1) a first value is (pre) set for store_read_freq[0]=read_freq without comparisons made.

The step 3000b corresponds to an increase of i by one (i++).

That is, in the step 3000a the first value for store_read_freq[0] is set without making comparisons.

In the step 3000b the value for store_read_freq[1] is set and the first comparison is made, and the procedure goes on with block 3000, where binary search halving is started where store_read_freq[i] is set equal to read_freq (as read from the counter 262 in the block 26).

At block 3001 a check is made as to whether $$|f\_des\_cycle - store\_read\_freq[i]| < |f\_des\_cycle - store\_read\_freq[i-1]|$$

with VCOBAND=store_read_freq[i].

In response to the check at block 3001 yielding a positive outcome (YES) the binary search halving index is increased by one (#i+1) at block 3002 and the procedure returns to block 3000.

In response to the check at block 3001 yielding a negative outcome (NO) a check is made in a block 3003 comparing read_freq with f_des plus or minus a tolerance value tol.

If the check of block 3003 indicates (outcome I) that read_freq<f_des_cycle−tol then, in block 3004:

a new minimum value new_min is set equal to the previous minimum value old_min increased by one, namely new_min=old_min+1 a new maximum value new_max is set equal to the previous maximum value old_max increased by one, namely new_max=old_max+1.

Conversely, if the check of block 3003 indicates (outcome II) that read_freq>f_des_cycle+tol then, in block 3005:

a new minimum value new_min is set equal to the previous minimum value old_min decreased by one, namely new_min=old_min−1 a new maximum value new_max is set equal to the previous maximum value old_max decreased by one, namely new_max=old_max−1

The binary search then proceeds back to block 3000 until the index i reaches the threshold value N.

The diagrams of FIGS. 9A and 9B show possible time behaviors of the frequency read_freq supplied from the counter 26 to the FSM 122 in the case of:

a positive outcome (Y) of the check in block 3001, namely|f_des_cycle−store_read_freq[i]|<|f_des_cycle−store_read_freq[i−1]|(FIG. 9A), and a negative outcome (N) of the check in block 3001, namely|f_des_cycle−store_read_freq[i]|>|f_des_cycle−store_read_freq[i−1]|(FIG. 9B).

The diagrams of FIGS. 9A and 9B show a (much) faster advance from VCOBAND (coarse) calibration to VCODAC (fine) calibration in the case of FIG. 9A.

The representation of FIG. 10 further highlights that the PLL VCO calibration technique presented herein facilitates an FSM such as the FSM 122 in performing a dichotomous procedure in searching an adequate "digital" capacitance (e.g., an AFC code such as $b_0$, $b_1$, $b_2$, $b_3$) to calibrate (tune) the VCO by setting a correct central frequency.

As discussed, during VCO calibration, the FSM 122 operates in open-loop condition, with a constant Vtune voltage (e.g., 0.5V), with the capability of facilitating PLL lock-in even in conditions of non-monotonicity of the VCO characteristic.

The representation of FIG. 10 refers, purely by way of example, to a dichotomous procedure starting with 32 (thirty-two, namely 25) "candidate" frequencies between a minimum (lower bound) frequency min (labelled O) and a maximum (upper bound) frequency max (labelled 31).

As represented in FIG. 10 the procedure involves halving steps leading to selecting at each step a central frequency designated center based on the relationship:

center=int[(max+min)/2]

where int[.] denotes the (lower) nearest integer value.

As represented in FIG. 10 (and also partly indicated in FIG. 7), the procedure leads to subsequently selecting values for the central frequency equal to 15, 7, 11, 13, 14, 13 and 12 (final value).

It will be appreciated that the steps down to the step leading to the central frequency being selected as int [(max+min)/2]=14 involve halving the frequency gamut by "cutting" at its lower end.

Conversely, the step leading to the central frequency being selected as int [(max+min)/2]=13 marks an "inversion" with the halved frequency gamut moved leftwards (first extended at its lower end from 13 to 12 and cut at its upper end from 15 to 14 and then further cut at its upper end from 14 to 13 to finally converge to int [(max+min)/2]=12.

Without prejudice to the underlying principles, the details and embodiments may vary, even significantly, with respect to what has been described by way of example only without departing from the extent of protection.

The extent of protection is determined by the annexed claims.

What is claimed is:

1. A method of calibrating a voltage-controlled oscillator (VCO) in a phase-locked loop circuit, the method comprising a dichotomous search in a set of candidate frequency bands via a sequence of subsequent halving steps with index i=1, . . . , N that produce reduced subsets of the set of candidate frequency bands, the reduced subsets having respective upper bound values, lower bound values, and central values, a central value of a subset resulting from the halving step of the index i in the sequence being a function of an average of an upper bound value and a lower bound value of a subset resulting from the halving step of index i−1 in the sequence, the method comprising:
   identifying a desired calibration frequency for the VCO, f_des_cycle, as a number of cycles counted in a reference clock signal;
   reading a current frequency value, read_freq, which is a function of a current operation frequency of the VCO;
   performing the dichotomous search by:
   storing a stored frequency value store_read_freq[i]=read_freq for i=1; and
   calculating a first modulus value, |f_des_cycle−store_read_freq[i]| and a second modulus value, |f_des_cycle−store_read_freq[i−1]|;
   checking whether the first modulus value, |f_des_cycle−store_read_freq[i]| is lower than the second modulus value|f_des_cycle−store_read_freq[i−1]|;
   in response to the checking yielding a positive outcome, performing a further halving step in the dichotomous search with the index i increased by one; or
   in response to the checking yielding a negative outcome:
   reducing by one the respective upper bound and lower bound of a current subset in the dichotomous search prior to resuming the dichotomous search in response to read_freq being higher than f_des_cycle plus a tolerance value; or
   increasing by one the respective upper bound and lower bound of the current subset in the dichotomous search prior to resuming the dichotomous search in response to read_freq being lower than f_des_cycle minus the tolerance value; and
   calibrating the VCO to a frequency resulting from the dichotomous search.

2. The method of claim 1, comprising starting the dichotomous search by setting a first value for store_read_freq[O]=read_freq without comparisons made.

3. The method of claim 1, wherein the central value of the subset resulting from the i-th halving step in the sequence of subsequent halving steps in the dichotomous search is a nearest integer to the average of the upper bound value and the lower bound value of the subset resulting from the (i−1)-th halving step in the sequence.

4. The method of claim 3, wherein the central value of the subset resulting from the i-th halving step in the sequence of subsequent halving steps in the dichotomous search is a lower nearest integer to the average of the upper bound value and the lower bound value of the subset resulting from the (i−1)-th halving step in the sequence.

5. The method of claim 1, wherein the sequence of subsequent halving steps in the dichotomous search comprises:
   a first, coarse search section performed with a first value for the tolerance value; and
   a second, fine search section performed with a second value for the tolerance value, the second value being smaller than the first value.

6. The method of claim 5, wherein the first value and the second value for the tolerance value are six and unity.

7. The method of claim 1, wherein calibrating the VCO includes selectively activating and de-activating capacitors in a set of 2N capacitors in a capacitor bank according to a binary code.

8. The method of claim 7, wherein the dichotomous search includes up to N subsequent halving steps.

9. The method of claim 1, further comprising:
   setting at least one threshold value for a number of subsequent halving steps in the dichotomous search, and
   issuing a calibration error message in response to the number of subsequent halving steps in the dichotomous search reaching the threshold value.

10. The method of claim 5, further comprising:
    setting a first threshold value for a number of subsequent halving steps in the first, coarse search section in the dichotomous search, and issuing a first calibration error message in response to the number of subsequent halving steps in the first, coarse search section in the dichotomous search reaching the first threshold value, and
    setting a second threshold value for the number of subsequent halving steps in the second, fine search section in the dichotomous search, and issuing a second calibration error message in response to the number of subsequent halving steps in the second, fine search section in the dichotomous search reaching the second threshold value.

11. The method of claim 1, further comprising performing the dichotomous search in an open-loop condition of the phase-locked loop circuit.

12. A phase-locked loop circuit comprising:
    a voltage-controlled oscillator (VCO);
    a counter configured to read a current frequency value, which is a function of a current operation frequency of the VCO; and
    a finite state machine configured to:
    identifying a desired calibration frequency for the VCO, f_des_cycle, as a number of cycles counted in a reference clock signal;
    receive from the counter the current frequency value;
    perform a dichotomous search in a set of candidate frequency bands via a sequence of subsequent halving steps with index i=1, . . . , N that produce reduced subsets of the set of candidate frequency bands, the reduced subsets having respective upper bound values, lower bound values, and central values, a central value of a subset resulting from the halving step of the index i in the sequence being a function of an average of an upper bound value and a lower bound value of a subset resulting from the halving step of index i−1 in the sequence, the dichotomous search comprising the finite state machine configured to:
    store a stored frequency value store_read_freq[i]=read_freq for i=1; and calculate a first modulus value, |f_des_cycle−store_read_freq[i]| and a second modulus value, |f_des_cycle−store_read_freq[i−1]|;

check whether the first modulus value, |f_des_cycle−store_read_freq[i]| is lower than the second modulus value|f_des_cycle−store_read_freq[i−1]|;

in response to the check yielding a positive outcome, perform a further halving step in the dichotomous search with the index i increased by one; or in response to the check yielding a negative outcome:

reduce by one the respective upper bound and lower bound of a current subset in the dichotomous search prior to resuming the dichotomous search in response to read_freq being higher than f_des_cycle plus a tolerance value; or increase by one the respective upper bound and lower bound of the current subset in the dichotomous search prior to resuming the dichotomous search in response to read_freq being lower than f_des_cycle minus the tolerance value and apply calibration signals to the VCO to calibrate the voltage-controlled oscillator in accordance with a frequency resulting from the dichotomous search.

13. The phase-locked loop circuit of claim 12, wherein the finite state machine is configured to start the dichotomous search by setting a first value for store_read_freq[O]=read_freq without comparisons made.

14. The phase-locked loop circuit of claim 12, wherein the central value of the subset resulting from the i-th halving step in the sequence of subsequent halving steps in the dichotomous search is a nearest integer to the average of the upper bound value and the lower bound value of the subset resulting from the (i−1)-th halving step in the sequence.

15. The phase-locked loop circuit of claim 14, wherein the central value of the subset resulting from the i-th halving step in the sequence of subsequent halving steps in the dichotomous search is a lower nearest integer to the average of the upper bound value and the lower bound value of the subset resulting from the (i−1)-th halving step in the sequence.

16. The phase-locked loop circuit of claim 12, wherein the sequence of subsequent halving steps in the dichotomous search comprises:
a first, coarse search section performed with a first value for the tolerance value; and
a second, fine search section performed with a second value for the tolerance value, the second value being smaller than the first value.

17. The phase-locked loop circuit of claim 12, wherein the finite state machine configured to calibrate the VCO includes the finite state machine configured to selectively activate and de-activate capacitors in a set of 2N capacitors in a capacitor bank according to a binary code.

18. The phase-locked loop circuit of claim 17, wherein the dichotomous search includes up to N subsequent halving steps.

19. The phase-locked loop circuit of claim 12, wherein the finite state machine is configured to:
set at least one threshold value for a number of subsequent halving steps in the dichotomous search, and
issue a calibration error message in response to the number of subsequent halving steps in the dichotomous search reaching the threshold value.

20. The phase-locked loop circuit of claim 12, wherein the finite state machine is configured to perform the dichotomous search in an open-loop condition of the phase-locked loop circuit.

* * * * *

UNITED STATES PATENT AND TRADEMARK OFFICE
CERTIFICATE OF CORRECTION

| | |
|---|---|
| PATENT NO. | : 12,088,310 B2 |
| APPLICATION NO. | : 18/192285 |
| DATED | : September 10, 2024 |
| INVENTOR(S) | : Fortunato et al. |

Page 1 of 1

It is certified that error appears in the above-identified patent and that said Letters Patent is hereby corrected as shown below:

In the Claims

In Column 9, in Claim 2, Line 56, delete "store_read_freq[O]" and insert -- store_read_freq[0] --.

In Column 11, in Claim 13, Line 26, delete "store_read_freq[O]" and insert -- store_read_freq[0] --.

Signed and Sealed this
Twenty-ninth Day of October, 2024

Katherine Kelly Vidal
*Director of the United States Patent and Trademark Office*